United States Patent
Chen et al.

[19]

[11] Patent Number: 5,901,257
[45] Date of Patent: May 4, 1999

[54] SINGLE CHIP COLOR MOS IMAGE SENSOR WITH TWO LINE READING STRUCTURE AND IMPROVED COLOR FILTER PATTERN

[75] Inventors: Datong Chen, Fremont; Tai-Ching Shyu, Cupertino; Xinping He, San Jose, all of Calif.

[73] Assignee: OmniVision Technologies, Inc., Sunnyvale, Calif.

[21] Appl. No.: 08/642,537

[22] Filed: May 3, 1996

[51] Int. Cl.⁶ .................................................. G06K 7/00
[52] U.S. Cl. .................................................. 382/312
[58] Field of Search ........................... 382/312; 348/281, 348/305, 276, 277, 279, 275, 164

[56] References Cited

U.S. PATENT DOCUMENTS

| | | | |
|---|---|---|---|
| 4,513,312 | 4/1985 | Takemure | 348/275 |
| 4,542,409 | 9/1985 | Ochi | 348/281 |
| 4,652,911 | 3/1987 | Teranshi et al. | 348/279 |
| 4,686,373 | 8/1987 | Tew et al. | 348/164 |
| 4,939,573 | 7/1990 | Teranishi et al. | 348/276 |
| 5,282,025 | 1/1994 | Sato | 358/44 |

OTHER PUBLICATIONS

Hodgson, R.M., et al., "Charge transfer devices and their application" *New Zealand Engineering*, 34:246–249 (1979).
Watanabe, T., et al., "A CCD color signal separation IC for single–chip color imagers," *IEEE Journal of Solid–State Circuits*, SC–19, No. 1:49–54 (1984).
Tsuruta, S., et al., "Color pixel arrangement evaluation for LC–TV," *Conference Record of the 1985 International Display Research Conference*, 85 CH2239:24–26 (1985).
Parulski, K. A., Color filters and processing alternatives for one–chip cameras, *IEEE Transactions on Electron Devices*, ED–32 No. 8:1381–1389 (1985).
Imaide, T., et al., Single–chip color cameras with reduced aliasing, *Journal of Imaging Technology*, 2, No. 5:258–260 (1986).

Cormier, D., Solid–state optical sensors improve their image,*ESD: The Electronic System Design Magazine*, 36–42 (1989).
Onga, M., et al., New signal processing LSIs for the 8mm camcorder, *IEEE Transactions on Consumer Electronics*, 36, No. 3:494–501 (1990).
Fossum, E.R., Active pixel sensors: Are CCD's dinosaurs?, *SPIE*, 1900:2–14 (1993).
Mendis, S.K., et al., Progress in CMOS active pixel image sensors, *SPIE*, 2172:19–29 (1994).
Nixon, P.B., et al., 128×128 CMOS photodiode–type active pixel sensor with on–chip timing, control and signal chain electronics, *SPIE*vol. 2415:117–122 (1994).
Denyer, P.B., et al., Intelligent CMOS imaging, *SPIE*, 2415:285–291 (1995).

*Primary Examiner*—Jose L. Couso
*Assistant Examiner*—Anh Hong Do
*Attorney, Agent, or Firm*—Christensen O'Connor Johnson & Kindness PLLC

[57] ABSTRACT

The present invention is directed to a single chip color MOS image sensor with a novel two-line reading structure which is compatible with MOS fabrication technology. The invention allows the simultaneous reading of line signals from two adjacent rows of pixels so that combinations of signals from pixels in adjacent rows may be obtained without the use of an external delay line device. The sensor includes a pixel array having superimposed thereon an improved color filter pattern and a two-line reading structure which may be doubled so as to provide four line signals. The reading structure includes sets of storage capacitors on which the pixel signals are stored, and a means for reading the signals from the capacitors in such a way that signals from pixels in adjacent rows may be combined. The approximate ratios of the colors in the improved color filter pattern are one-half green, one-fourth yellow, and one-fourth cyan.

18 Claims, 7 Drawing Sheets

| G | B | G | R |
|---|---|---|---|
| R | G | B | G |
| G | B | G | R |
| R | G | B | G |

*Fig. 4A.*
(PRIOR ART)

| Cy | W | Ye | G |
|---|---|---|---|
| Ye | G | Cy | W |
| Cy | W | Ye | G |
| Ye | G | Cy | W |

*Fig. 4B.*
(PRIOR ART)

| Ye | G | Ye | G |
|---|---|---|---|
| G | Cy | G | Cy |
| Ye | G | Ye | G |
| G | Cy | G | Cy |

SINGLE CHIP COLOR MOS IMAGE SENSOR WITH TWO LINE READING STRUCTURE AND IMPROVED COLOR FILTER PATTERN

FIELD OF THE INVENTION

The present invention relates to metal oxide semiconductor (MOS) image sensors, and more particularly, a single chip MOS image sensor having a novel two-line reading structure and an improved color filter pattern.

BACKGROUND OF THE INVENTION

Integrated circuit technology has revolutionized various fields including computers, control systems, telecommunications, and imaging. In the field of imaging, the charge coupled device (CCD) sensor has made possible the manufacture of relatively low cost and small hand-held video cameras. Nevertheless, the solid-state CCD integrated circuits needed for imaging are relatively difficult to manufacture, and therefore are expensive. In addition, because of the differing processes involved in the manufacture of CCD integrated circuits relative to MOS integrated circuits, the signal processing portion of the imaging sensor has typically been located on a separate integrated chip. Thus, a CCD imaging device includes at least two integrated circuits: one for the CCD sensor and one for the signal processing logic.

Some of the further drawbacks of CCD technology are discussed in "Active Pixel Sensors—Are CCD's Dinosaurs?" by E. R. Fossum, *Proceedings of the SPIE— The International Society for Optical Engineering*, vol. 1900, pp. 2–14, 1993. As stated therein, "[a]lthough CCDs have become a technology of choice for present-day implementation of imaging and spectroscopic instruments due to their high sensitivity, high quantum efficiency, and large format, it is well-known that they are a particularly difficult technology to master. The need for near-perfect charge transfer efficiency makes CCDs (1) radiation "soft," (2) difficult to reproducibly manufacture in large array sizes, (3) incompatible with the on-chip electronics integration requirements of miniature instruments, (4) difficult to extend the spectral responsivity range through the use of alternative materials, and (5) limited in their readout rate."

An alternative low cost technology to CCD integrated circuits is the metal oxide semiconductor (MOS), integrated circuit. Not only are imaging devices using MOS technology less expensive to manufacture relative the CCD imaging devices, for certain applications MOS devices are superior in performance. For example, the pixel elements in a MOS device can be made smaller and therefore provide a higher resolution than CCD image sensors. In addition, the signal processing logic necessary can be integrated alongside the imaging circuitry, thus allowing for a single integrated chip to form a complete stand alone imaging device.

Examples of MOS imaging devices are detailed in "A ¼ Inch Format 250K Pixel Amplified MOS Image Sensor Using CMOS Process" by Kawashima et al., *IEDM* 93-575 (1993), and "A Low Noise Line-Amplified MOS Imaging Devices" by Ozaki et al., *IEEE Transactions on Electron Devices*, Vol. 38, No. 5, May 1991. In addition, U.S. Pat. No. 5,345,266 to Denyer titled "Matrix Array Image Sensor Chip" describes a MOS image sensor. The devices disclosed in these publications provide a general design approach to MOS imaging devices. In addition, MOS approaches to color imaging devices are described in "Color Filters and Processing Alternatives for One-Chip Cameras", by Parulski, *IEEE Transactions on Electron Devices*, Vol. ED-32, No. 8, August 1985, and "Single-Chip Color Cameras With Reduced Aliasing" by Imaide et al., *Journal of Imaging Technology*, vol. 12, no. 5, pp. 258–260, October 1986.

In the MOS solid-state color image sensors, a complementary color filter pattern is often used. Arrays of pixels may be made to detect color by being covered with a regular pattern of color filter patches, known as a color filter pattern. The filter patches can be fabricated directly on the sensor or on a transparent substrate which is later cemented to the chip. Color filter patterns may include colors such as red (R), green (G), blue (B), yellow (Ye), cyan (Cy) and magenta (Mg). The pixels beneath the color filter pattern emit signals when they are exposed to the type of light indicated by the color filter patch. Thus, a red signal could be obtained from a pixel beneath a red filter patch, a blue signal could come from a pixel beneath a blue filter patch, and so on.

However, some image sensors do not obtain the standard red, green and blue signals from red, green and blue filtered pixels. Instead, they use combinations of other colors to obtain the standard ones. For example, red (R) can be formed according to the equation R=(W+Ye)−(G+Cy), where the color filter pixel signals are W=white, Ye=yellow, G=green, and Cy=cyan. In cases such as this, the four pixel signals being processed are obtained from a 2×2 block of one of each type of pixel sensors, rather than a 1×4 row of pixel sensors which would tend to distort the color image. The 2×2 block presents a problem for standard pixel scanning methods because standard methods scan each row, one at a time. In contrast, the 2×2 block of pixels comes from sections of two separate rows. Thus, the system cannot process the data as it scans each row. It must wait until the next row is also scanned to obtain the remaining information which it needs, and it must somehow save the data from the previous row until it does so.

Just as the color signals in such cases can be a combination of the signals from a 2×2 pixel block, the chrominance signal, which correlates to the color of the image, is also sometimes obtained from a combination of signals from pixels in two separate rows. In fact, this is the case for the chrominance signal in many systems, even those in which R, G and B filters are used to obtain the color signals directly. Therefore, it is required in such systems to somehow have the data from two separate rows available at the same time so that the required combinations can be processed. In most prior art devices, an external one-line delay line (e.g. a CCD delay line) is used for this purpose. The delay line scans in one row and holds the data until the next row can be scanned to provide the needed information.

In the movement from CCD to MOS based implementations, methods of implementing the circuitry have been sought which can easily be fabricated on a single MOS chip. The approach of using an external delay line device in the MOS color image sensors, which was carried over from the old CCD technology, has inherently required the use of components which are external to the MOS circuit and which are sometimes required to be on a separate chip, in addition to increasing the relative complexity of the implementation. It is a general principle that power consumption and cost would decrease if the number of chips and complex components necessary to accomplish the task were decreased. The present invention is directed towards a solution which provides the needed data from two rows of pixels at the same time, without using an external delay line device, and which can be integrated on a single chip with the MOS sensor array.

In addition, the color filter patterns used in the prior art MOS color image sensors, from which the needed data is obtained, are also often not optimized. Any color can be thought of as a mixture of the three primary colors: red, blue, and green. However, as is known in the art, humans do not process red, green, and blue equally. Rather, humans rely upon the three primary colors in approximate accordance with: 0.6Green+0.3Red+0.1Blue. Thus, to the human eye, green is the most important color, red is the next most important, and blue is the least most important. Based upon this knowledge, the pixel array should have a color filter pattern (also referred to as a color coding scheme) that is more heavily weighted along the lines of green than red or blue. Prior art color coding schemes have attempted to achieve this in various ways.

The prior art has shown that checkerboard patterns are superior to linear ones. One of the most common schemes uses a matrix in which every other pixel is green (G), and the remaining pixels form a checkerboard pattern of alternating red (R) and blue (B). Another pattern uses a checkerboard pattern of equal amounts of cyan (Cy), yellow (Ye), white (W) and green (G). A noted advantage of using the colors cyan, yellow and green is that since green is formed by overlapping yellow and cyan, only two filter fabrication mask steps are needed, as opposed to the three needed for a RGB filter. The present invention discloses a different color filter pattern, using green, yellow and cyan, which is optimized for sensitivity.

SUMMARY OF THE INVENTION

The present invention is directed to a single chip color MOS image sensor with a novel two-line reading structure which allows the simultaneous reading of line signals from two adjacent rows of pixels so that combinations of signals from pixels in adjacent rows may be obtained without the use of an external delay line device. The sensor includes a pixel array having superimposed thereon an improved color filter pattern, a two-line reading structure with a first set of storage capacitors, a first set of switches for selectively placing signals from a first row of the pixel array on the first set of storage capacitors, a second set of storage capacitors, a second set of switches for selectively placing signals from a row adjacent to said first row of the pixel array on the second set of storage capacitors, and at least a third and fourth set of switches for selectively reading out said signals from the storage capacitors on output lines as a set of line signals. The two-line reading structure may be repeated so as to provide four line signals. The capacitors, MOS switches and amplifiers of the reading structure are easily fabricated as part of a MOS image sensor on a single chip. Also, the improved color filter pattern of the device, which includes green, yellow and cyan, requires only two filter fabrication mask steps, and is designed for optimal sensitivity.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
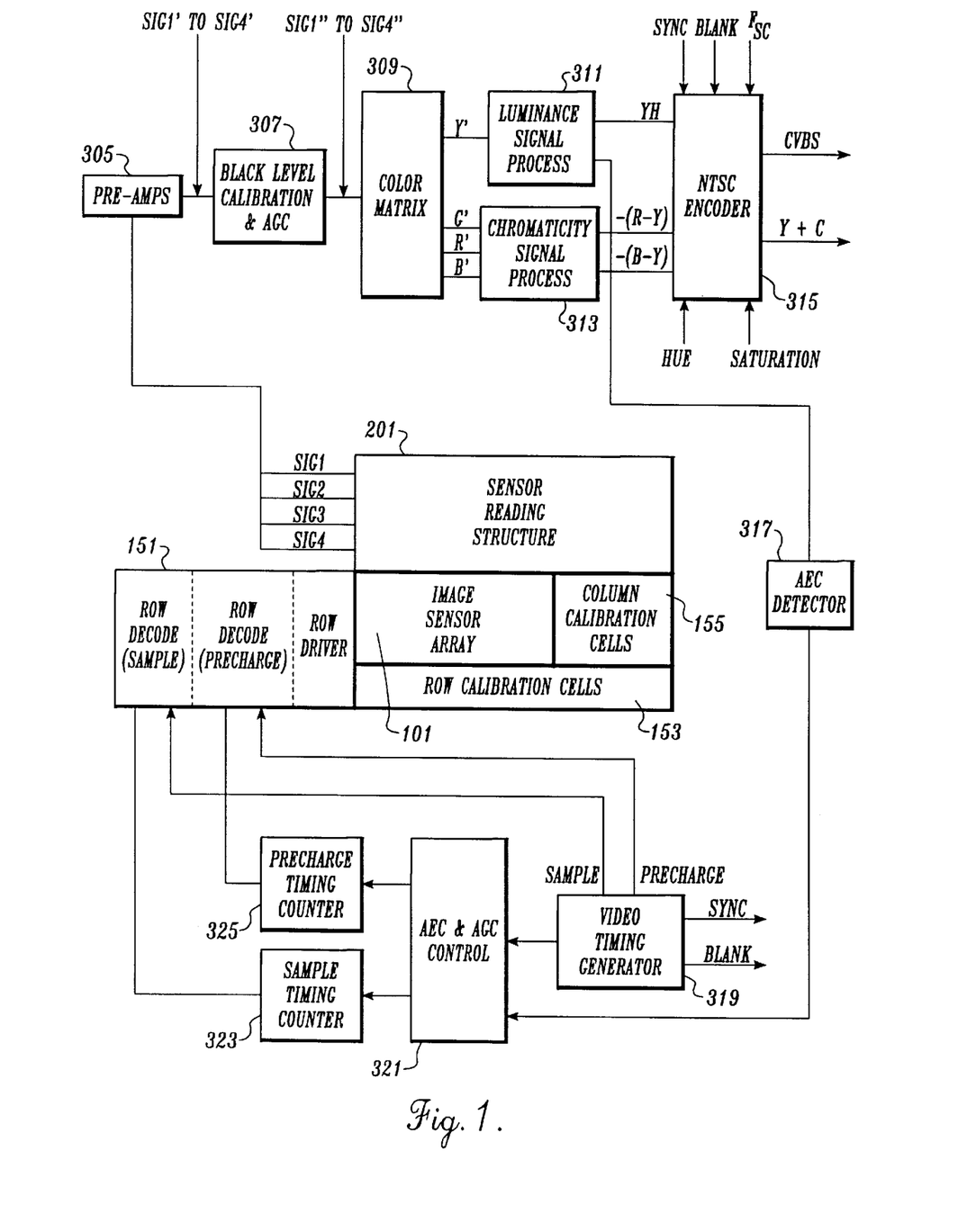
FIG. 1 is a block diagram of a single-chip CMOS imaging sensor formed in accordance with the present invention.

With reference to FIG. 1, a block diagram of a single-chip CMOS imaging sensor includes an image sensor array 101. The retrieval of information from the image sensor array is done by the peripheral circuitry of FIG. 1 and the output is done in accordance with the well known NTSC scheme. This scheme allows the output signals from the circuit to be transmitted and displayed by conventional means.

The signals from the sensor array 101 are processed by a sensor reading structure 201, which is formed in accordance with the present invention. As will be later explained, this novel reading structure allows the reading of two line signals from two separate rows of pixels simultaneously, without the use of an external delay line device. The sensor reading structure 201 outputs line signals SIG1, SIG2, SIG3 and SIG4, which are amplified by signal amplifiers 305. In one actual embodiment, the signal amplifiers 305 are formed in accordance with co-pending application Ser. No. 08/538,441 entitled "IMPROVED CHARGE AMPLIFIER FOR MOS IMAGING ARRAY AND METHOD OF MAKING SAME" to Shyu et al. filed Oct. 3, 1995 and co-pending application Ser. No. 08/617,313 entitled "IMPROVED CHARGE AMPLIFIER FOR MOS IMAGING ARRAY AND METHOD OF MAKING SAME" to Shyu et al. filed Mar. 18, 1996 and both herein incorporated by reference.

Amplified line signals SIG1', SIG2', SIG3' and SIG4' from the signal amplifiers 305 are then processed by processor 307 which performs automatic gain control amplification and black level calibration. The black level calibration attempts to eliminate the portion of the signal which exists when no light is being detected, as is known in the art, thus allowing for a truer zero reference signal so that the later signal processing is improved. The automatic gain control amplifiers (AGC) amplify the signals at a controlled level for further processing.

Processed line signals SIG1" to SIG4" from processor 307 go to the color matrix 309. The color matrix 309 combines the line signals in various proportions according to matrix equations and also performs gamma correction so as to derive the output color signals, such as green (G'), red (R'), blue (B'), or the luminance signal (Y'). The "prime" indicates the signal has undergone gamma correction. The red (R') and blue (B') output color signals may be obtained as a function of the difference between two line signals, as will be explained later in more detail. The luminance signal (Y') is formed from a linear matrix function by which the other signals are combined in various proportions. The processor 311, which performs the luminance signal process, takes the signal Y' from the color matrix 309 and outputs the signal YH along with a feedback signal which goes to the AEC detector 317. The YH signal is the luminance signal with high frequency components.

The color signals G', R' and B' go from the color matrix 309 to the processor 313, which performs the chromaticity signal process, where they are processed so as to produce the signals –(R-Y) and –(B-Y), from which the chroma signal is formed. The chroma signal is formed by quadrature modulating the two color difference signals, (R-Y) and (B-Y), on a color subcarrier. In alternate systems, I (in phase) and Q (quadrature) color difference signals are sometimes used rather than (R-Y) and (B-Y), although the latter are what are most often used in consumer cameras. The phase and amplitude of the chroma signal indicate hue and saturation.

The NTSC encoder 315 receives control timing signals SYNC and BLANK from a video timing generator 319, and also receives control signals $F_{sc}$, HUE and SATURATION. The YH signal from the luminance signal process 311, and the color difference signals –(R-Y) and –(B-Y) from the chromaticity signal process 313, go to the NTSC encoder 315 where they are processed to produce the output signals CVBS (composite video with blank and sync) and the Y+C combined signal. The baseband luminance signal (Y) correlates to the brightness of the image, and the quadrature-modulated chrominance signal (C) correlates to the color of the image.

The processor 311, which performs the luminance signal process, outputs a feedback signal to the AEC detector 317, which outputs a control signal to the controller 321 which performs the AEC & AGC control. As is known in the art, AEC refers to automatic exposure control. The video timing generator 319 outputs timing signals SAMPLE and PRECHARGE which go to the sample and precharge areas of the array row controller 151, respectively, for purposes of controlling the scanning of the image sensor array 101. The array row controller 151 also includes a row driver section. The video timing generator 319 also outputs a timing signal to the controller 321 which performs the AEC & AGC control. The controller 321 outputs control signals to the sample timing counter 323 and to the precharge timing counter 325. The sample timing counter 323 and the precharge timing counter 325 are connected to the sample and precharge areas of the array row controller 151, respectively. The image sensor array 101 is controlled by the array row controller 151, the row calibration cells 153, and the column calibration cells 155.

As noted above, it is desirable that the sensor reading structure 201 be able to read two line signals from two separate rows in such a way that the needed portions of data from both rows is available to be processed at the appropriate time. Prior art devices have used delay lines for this purpose, where, for example, one row of pixels would be scanned into the delay line and held for a time necessary until the second row could be scanned. The problem with this approach is that the delay line is often external to the MOS imaging sensor, which can add to the number of chips and the complexity of the implementation. Thus, there is a need for a structure which can be easily fabricated on the same chip as the MOS sensor array and which can make available the needed signals from two separate rows of pixels during a specified processing interval.

Figure 2:
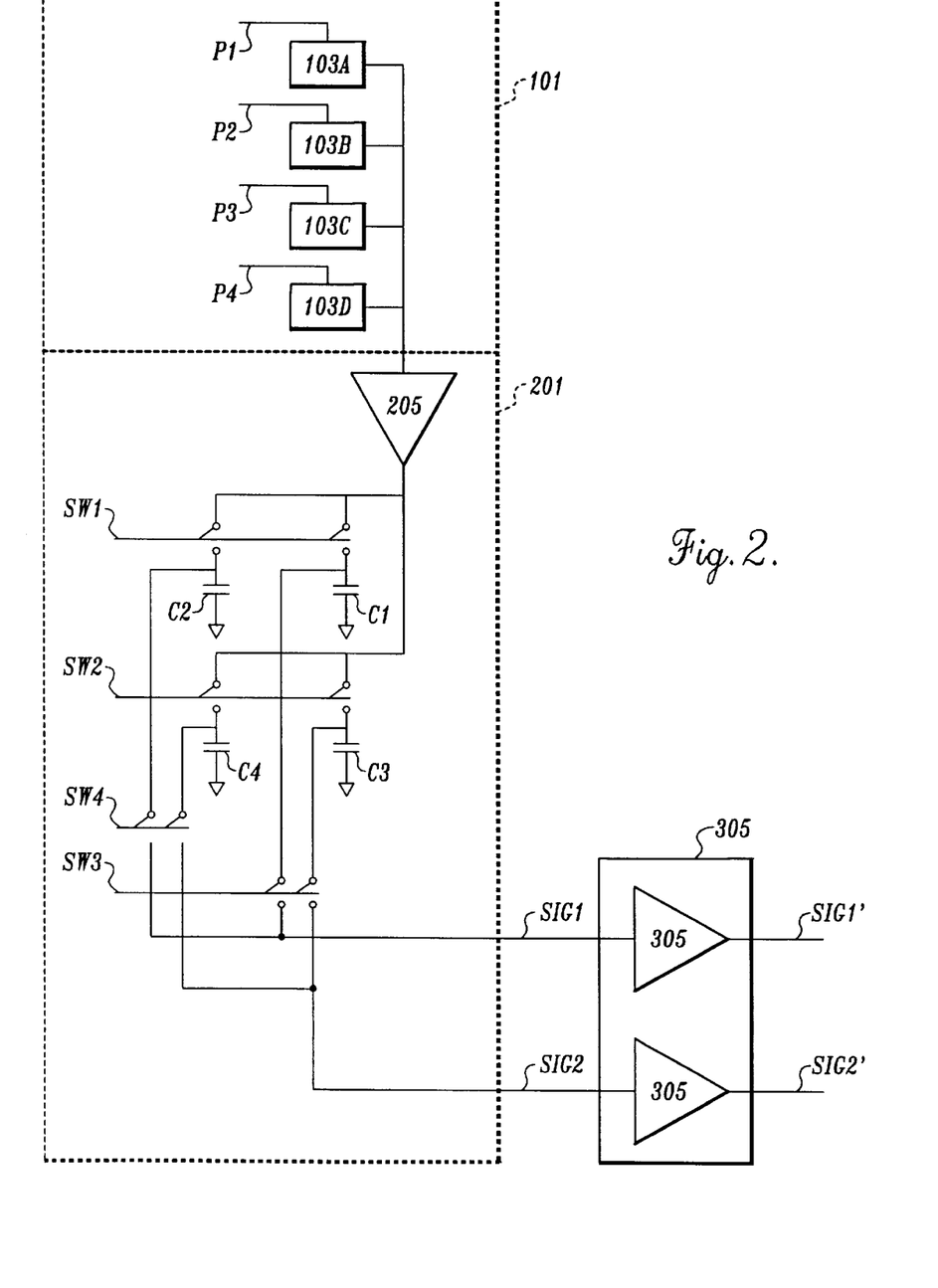
FIG. 2 is a schematic diagram of a simplified single-column two-line pixel reading structure formed in accordance with the present invention and shown for purposes of illustration.

Turning now to FIG. 2, a simplified single-column two-line sensor pixel reading structure 201 formed in accordance with the present invention is shown for purposes of illustration. This structure illustrates the method by which the present invention may read two line signals from two rows of pixels simultaneously and thus provide the needed portions of data from the two rows during the specified processing interval. As will be seen below, the structure of FIG. 2 forms the building block of an arbitrarily large image sensor array.

The sensor reading structure 201 reads a pixel sensor array 101 which includes a single column of pixels 103, designated as pixels 103A, 103B, 103C and 103D. The pixels 103A to 103D are controlled by pixel control signals P1, P2, P3 and P4, respectively. In a color image sensor, each pixel is covered by a color filter patch. The signals from the pixels 103A to 103D are alternately amplified by a signal amplifier 205. The signal amplifier 205 may be formed in accordance with co-pending application Ser. No. 08/538,441 entitled "IMPROVED CHARGE AMPLIFIER FOR MOS IMAGING ARRAY AND METHOD OF MAKING SAME" to Shyu et al. filed Oct. 3, 1995 and co-pending application Ser. No. 08/617,313 entitled "IMPROVED CHARGE AMPLIFIER FOR MOS IMAGING ARRAY AND METHOD OF MAKING SAME" to Shyu et al. filed Mar. 18, 1996.

The amplified pixel signals are temporarily stored on capacitors C1, C2, C3 and C4. The placement of the amplified pixel signals on the four capacitors is controlled by sets of switches SW1 and SW2. Switch SW1 places signals on capacitors C1 and C2, and switch SW2 places signals on capacitors C3 and C4. The stored pixel signals on the capacitors C1 to C4 are transferred to line signals SIG1 and SIG2 by two sets of output switches SW3 and SW4. Switch set SW3 places signals from capacitor C1 on line signal SIG1 and from capacitor C3 on line signal SIG2. Switch set SW4 places signals from capacitor C2 on line signal SIG1 and from capacitor C4 on line signal SIG2. Line signals SIG1 and SIG2 are further amplified by signal amplifiers 305 and become amplified line signals SIG1' and SIG2'. It should be noted that in the preferred embodiment, capacitors are used to store the amplified pixel signals. However, it can be appreciated that any type of memory cells may be used to store the signal. Indeed, most types of memory cells, such as DRAMs, SRAMs, and EEPROMs include therein a capacitor or capacitor-like device. Thus, the term capacitor as used herein shall mean any type of memory cell that can be used to store a signal.

The goal of the circuit in FIG. 2 is to simultaneously place on the line signals SIG1 and SIG2 signals from two pixels from adjacent rows. For example, pixel 103A will first be simultaneously read with pixel 103B, then pixel 103B will be simultaneously read with pixel 103C, and finally pixel 103C will be simultaneously read with pixel 103D. These simultaneous readings are accomplished by storing the signal from each pixel on two capacitors. Two capacitors are needed for each signal since each pixel signal (with the exception of the first and last pixel in the column) is read twice. For example, pixel 103B is simultaneously read with pixel 103A and then with pixel 103C.

Figure 3:
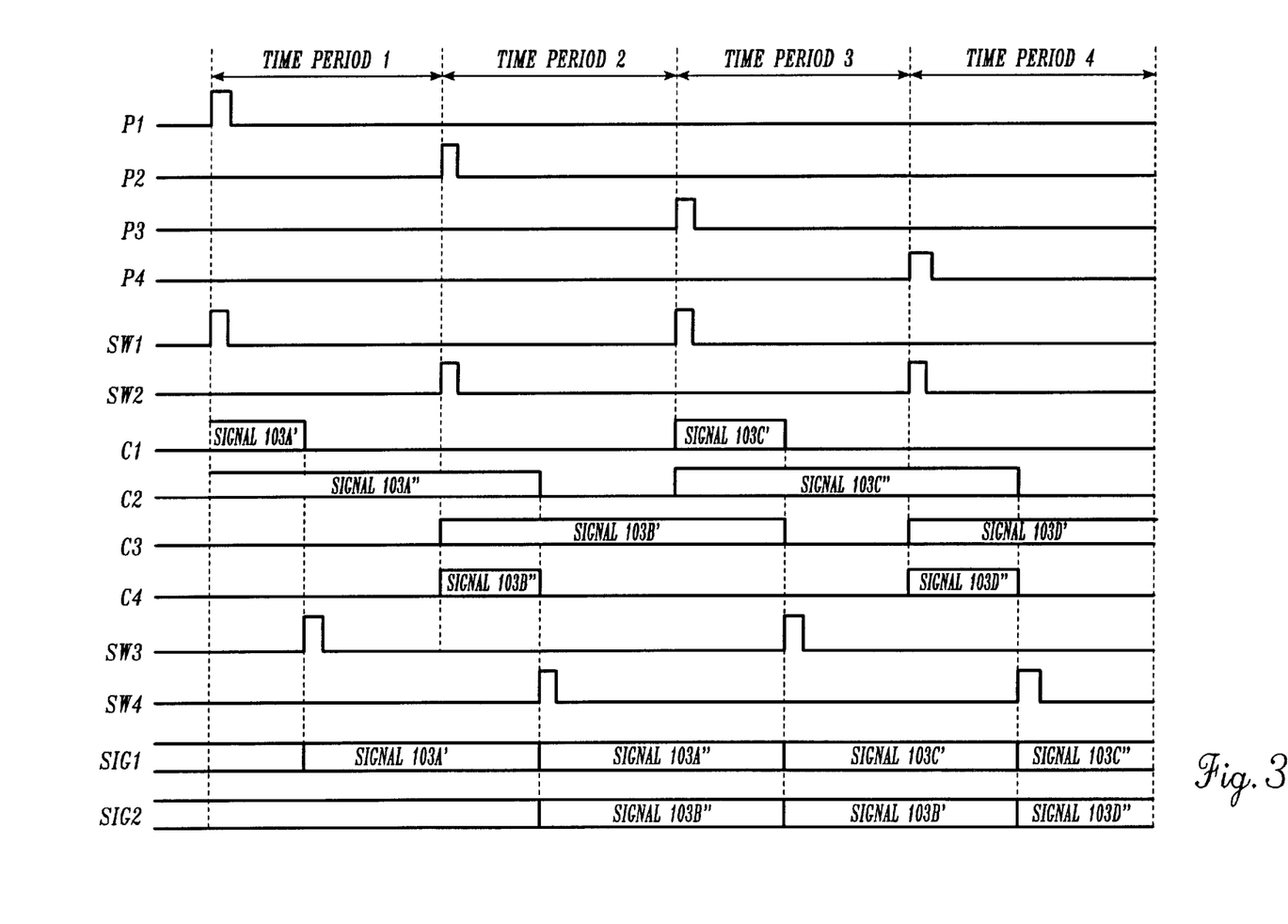
FIG. 3 is a timing diagram illustrating the operation of the single-column two-line pixel reading structure shown in FIG. 2.

The operation of the circuit in FIG. 2 is illustrated by the timing diagrams shown in FIG. 3. As shown in FIG. 3, at the beginning of time period 1, the pixel control signal P1 goes high at the same time as switch set SW 1. This causes the signal from pixel 103A to be amplified by signal amplifier 205 and stored on capacitors C1 and C2. Thus, the signal from pixel 103A is stored on two capacitors, and these two stored signals are referenced as stored pixel signal 103A' on capacitor C1, and stored pixel signal 103A" on capacitor C2. While the timing diagrams of FIG. 3 show these signals as being transferred instantaneously, it is understood that the actual transfer of these signals involves transient periods, due to the charging of the capacitors and similar phenomena, which are not shown in the diagrams. After pixel signal 103A' and pixel signal 103A" are stored, then output switch set SW3 goes high which causes stored pixel signal 103A' to be transferred from capacitor C1 to line signal SIG1. Although the timing diagrams for line signals SIG1 and SIG2 show the names of the pixel signals which are transferred to the line signals after the output switch sets SW3 or SW4 are activated, it is understood that the named signals do not necessarily remain on the line signals for the full time period shown in the diagram, and are shown there only for purposes of illustration as if the charge from each of the capacitors had been transferred to each of the line signals. Line signal SIG1 and line signal SIG2 are obtained simultaneously, although during time period 1, line signal SIG2 has not been shown to be charged with a signal.

At the beginning of time period 2, the pixel control signal P2 goes high at the same time as switch set SW2. This causes the signal from pixel 103B to be stored on capacitors C3 and C4, and these two stored signals are referenced as stored pixel signal 103B' and stored pixel signal 103B", respectively. Next, output switch set SW4 goes high which causes stored pixel signal 103B" to be transferred from capacitor C4 to line signal SIG2, and also simultaneously causes the stored pixel signal 103A", which was stored during time period 1, to be transferred from capacitor C2 to line signal SIG1. Thus, at the point during time period 2 when SW4 goes high, the line signals SIG1 and SIG2 contain the signals from pixels 103A and 103B, respectively, which are in adjacent rows, as is the goal of the system.

At the beginning of time period 3, the pixel control signal P3 goes high at the same time as switch set SW1. This causes the signal from pixel 103C to be stored on capacitors C1 and C2, and these two stored signals are referenced as stored pixel signal 103C' and stored pixel signal 103C", respectively. Next, output switch set SW3 goes high which causes stored pixel signal 103C' to be transferred from Capacitor C1 to line signal SIG1, and also simultaneously causes the stored pixel signal 103B', which was stored during time period 2, to be transferred from capacitor C3 to line signal SIG2. Thus, at the point during time period 3 when SW3 goes high, the line signals SIG1 and SIG2 contain the signals from pixels 103C and 103B, respectively, which are in adjacent rows, as is the goal of the system.

During time period 4, the process repeats as it did during time period 2, so as to cause the line signals SIG1 and SIG2 to contain the signals from pixels 103C and 103D, respectively, which are in adjacent rows, as is the goal of the system. The process of FIG. 3 is repeated until all of the rows of the pixel array have been processed.

Figure 4A:
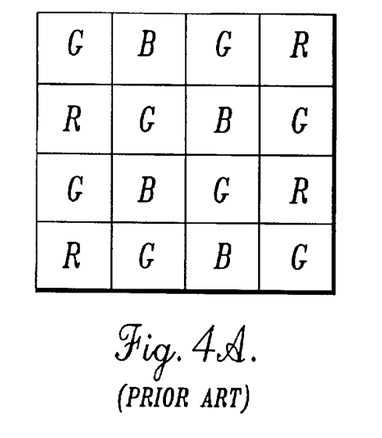
FIG. 4A is a diagram of a prior art color filter pattern.
Figure 4B:
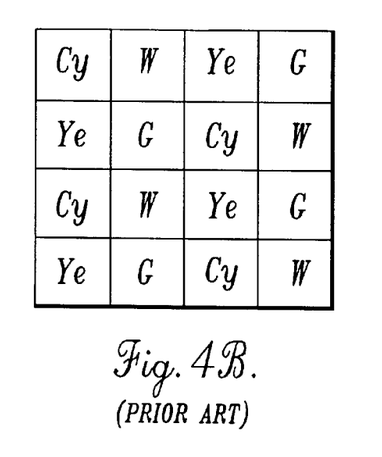
FIG. 4B is a diagram of a second prior art color filter pattern.

Turning now to FIG. 4A, a prior art color filter pattern is shown. This prior art color coding scheme is one of the most common and uses a half green (G) pattern, checkerboarded with red (R) and blue (B). FIG. 4B shows another prior art color coding scheme which uses equal amounts of cyan (Cy), yellow (Ye), white (W) and green (G), with the advantage that since green is formed by overlapping yellow and cyan, only two filter fabrication steps are needed as opposed to the three needed for a RGB filter. In FIG. 4B, the color red (R) may be derived according to the equation R=(W+Ye)−(G+Cy), and blue (B) may be derived from B=(W+Cy)−(Ye+G).

Figure 4C:
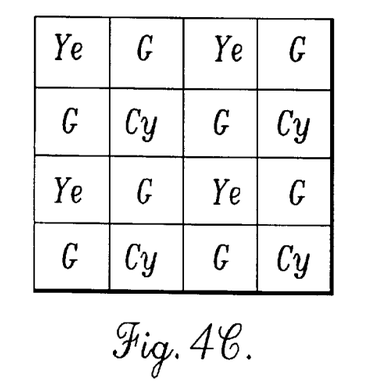
FIG. 4C is a diagram of the color filter pattern used in the preferred embodiment of the present invention.

In contrast, FIG. 4C shows the preferred color coding scheme of the present invention which uses the same proportion of green (G) components as the prior art color coding scheme of FIG. 4A, but uses yellow (Y) and cyan (Cy) to fill in the remainder rather than red (R) and blue (B). Similar to the prior art color coding scheme of FIG. 4B, in regard to the filter fabrication mask steps, green is formed by overlapping yellow and cyan, thus requiring only two filter fabrication mask steps.

Further, if the color filter has ideal spectral characteristics, then the color yellow can be the combination of green and red. Similarly, cyan can be the combination of green and blue. The specific equations used by the preferred embodiment for the color coding scheme of FIG. 4C are Ye=$G_{odd}$+αR (where Ye is yellow pixels, $G_{odd}$ is green pixels next to the yellow pixels which are all in odd numbered rows, R is red and α is a constant), and Cy=$G_{even}$+βB (where Cy is cyan pixels, $G_{even}$ is green pixels next to the cyan pixels which are all in even numbered rows, B is blue and β is a constant) and G=$G_{odd}$/2+$G_{even}$/2. Solving the first equation for R yields: R=(Ye−$G_{odd}$)/α, and solving the second equation for B yields: B=(Cy−$G_{even}$)/β. Also, with regard to the spatial frequency components, the equations which are used are: for the Y-channel, Fx=1/δx; Fy=1/δy, and for the C-channel, Fx=1/2δx; Fy=1/2δy, where δx is the width of a pixel component and δy is the length of a pixel component.

Figure 5A:
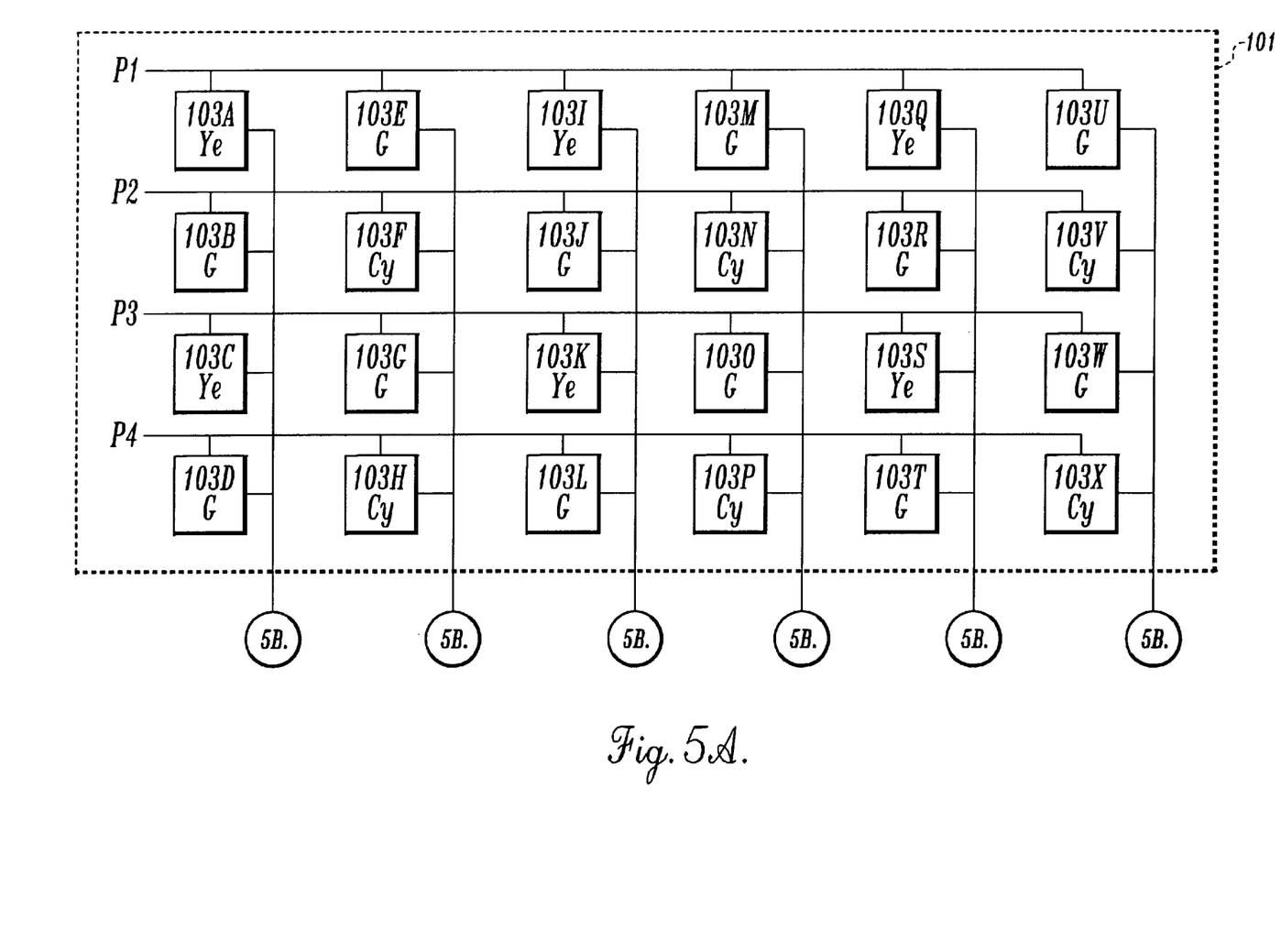
FIGS. 5A and 5B are schematic diagrams of the six-column two-line pixel reading structure formed in accordance with the present invention and using the preferred color filter pattern.
Figure 5B:
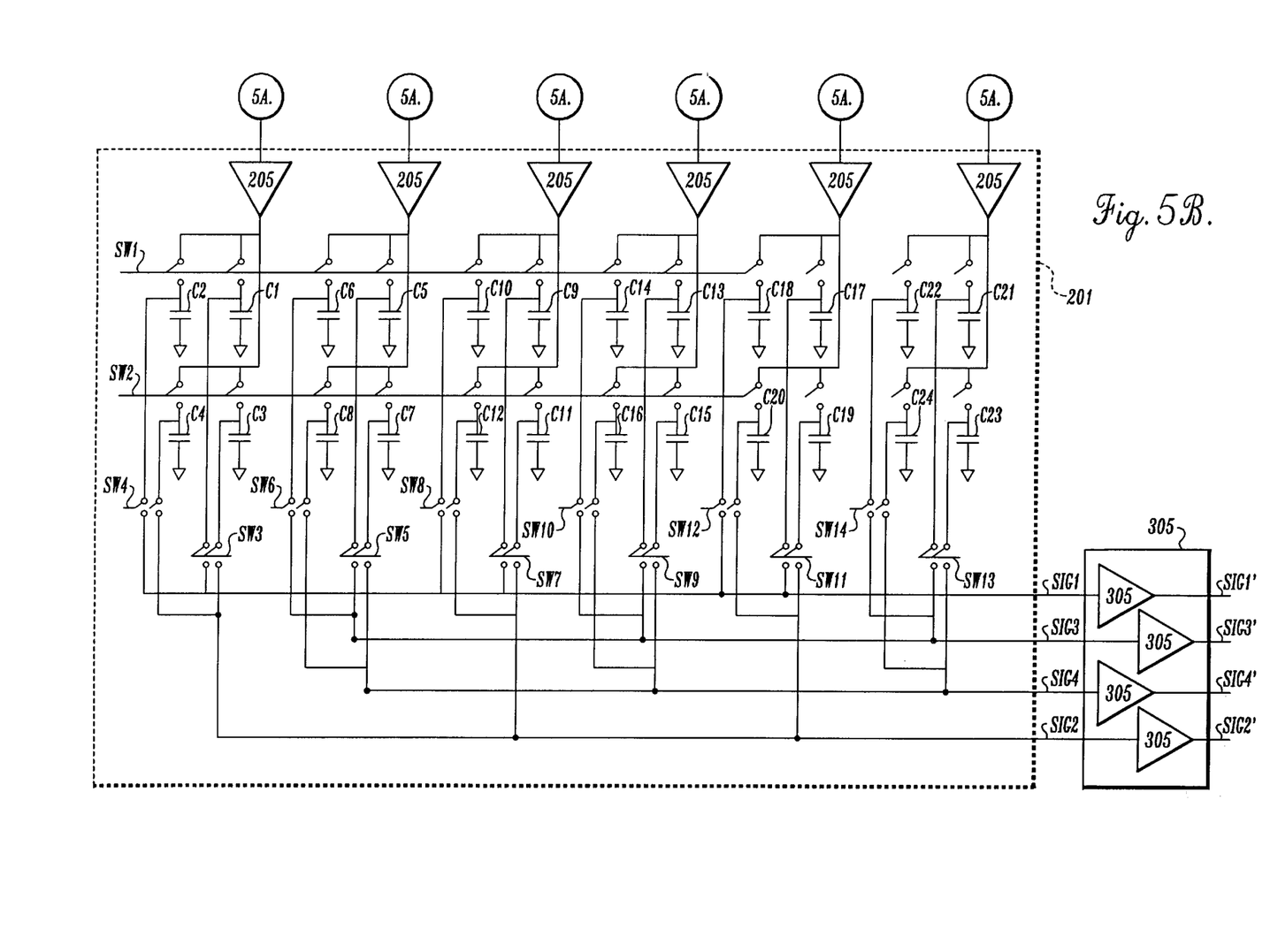

With reference to FIGS. 5A and 5B, a six-column two-line reading structure 201 is formed in accordance with the present invention and includes six columns of four rows of pixels 103. The preferred color coding scheme of FIG. 4C is also used. In this embodiment, the two-line reading structure is doubled so as to provide four line signals. The first column of pixels has pixels 103A to 103D, the second column has pixels 103E to 103H, and so on until the sixth column which has pixels 103U to 103X. Each row of pixels is controlled by a pixel control signal P1, P2, P3 or P4. All of the pixels in the first row, including pixels 103A, 103E, 103I, 103M, 103Q and 103U, are controlled by pixel control signal P1. The pixels in the second, third and fourth rows are similarly controlled by pixel control signals P2, P3 and P4, respectively.

The signals from the pixels in each of the six columns of pixels are alternately amplified by six signal amplifiers 205. The amplified pixel signals are temporarily stored on twenty-four capacitors C1 to C24, four for each column, including capacitors C1 to C4 for the first column, capacitors C5 to C8 for the second column, and so on until the sixth column where the signals are stored on capacitors C21 to C24. The placement of the amplified pixel signals on the twenty-four capacitors is controlled by two sets of switches SW1 and SW2. The stored pixel signals on the capacitors C1 to C24 are transferred to line signals SIG1, SIG2, SIG3 and SIG4 by twelve sets of output switches, two for each column, including switch sets SW3 and SW4 for the first column, switch sets SW5 and SW6 for the second column, and so on until the sixth column for which the output is controlled by switch sets SW13 and SW14. Line signals SIG1 and SIG2 receive the outputs from the first, third and fifth columns, while line signals SIG3 and SIG4 receive the outputs from the second, fourth and sixth columns. The signals on line signals SIG1 to SIG4 are amplified by signal amplifiers 305 and become amplified line signals SIG1' to SIG4'.

The goal of the circuit in FIGS. 5A and 5B is to simultaneously place on the pairs of line signals SIG1 and SIG2, or SIG3 and SIG4, signals from pixels from adjacent rows so that they can be further processed. For example, during a second time period (assuming the first time period was used to store a first set of values), the first and second pixels from the first column would be simultaneously read, then the first and second pixels from the second column would be simultaneously read, and so on until the sixth column where the first and second pixels from that column would be simultaneously read.

More specifically, with reference to FIGS. 5A and 5B, from the first column, pixel 103A would be simultaneously read with pixel 103B on line signals SIG1 and SIG2, respectively, then from the second column, pixel 103E would be simultaneously read with pixel 103F on line signals SIG3 and SIG4, respectively, then from the third column, pixel 103I would be simultaneously read with pixel 103J on line signals SIG1 and SIG2, respectively, and so on until the sixth column where pixel 103U would be simultaneously read with pixel 103V on line signals SIG3 and SIG4, respectively.

During the third time period, the second and third pixels from each column would be simultaneously read in a similar manner. Then, in the fourth time period, the third and fourth pixels from each column would be simultaneously read. These simultaneous readings of pixels from different rows are accomplished by the use of storage capacitors C1 to C24 which store the signal from each pixel on two capacitors during different time periods. Two capacitors are needed for each signal since each pixel signal (with the exception of the first and last pixel in each column) is read twice. For example, pixel 103B is simultaneously read with pixel 103A and then later with pixel 103C.

Figure 6:
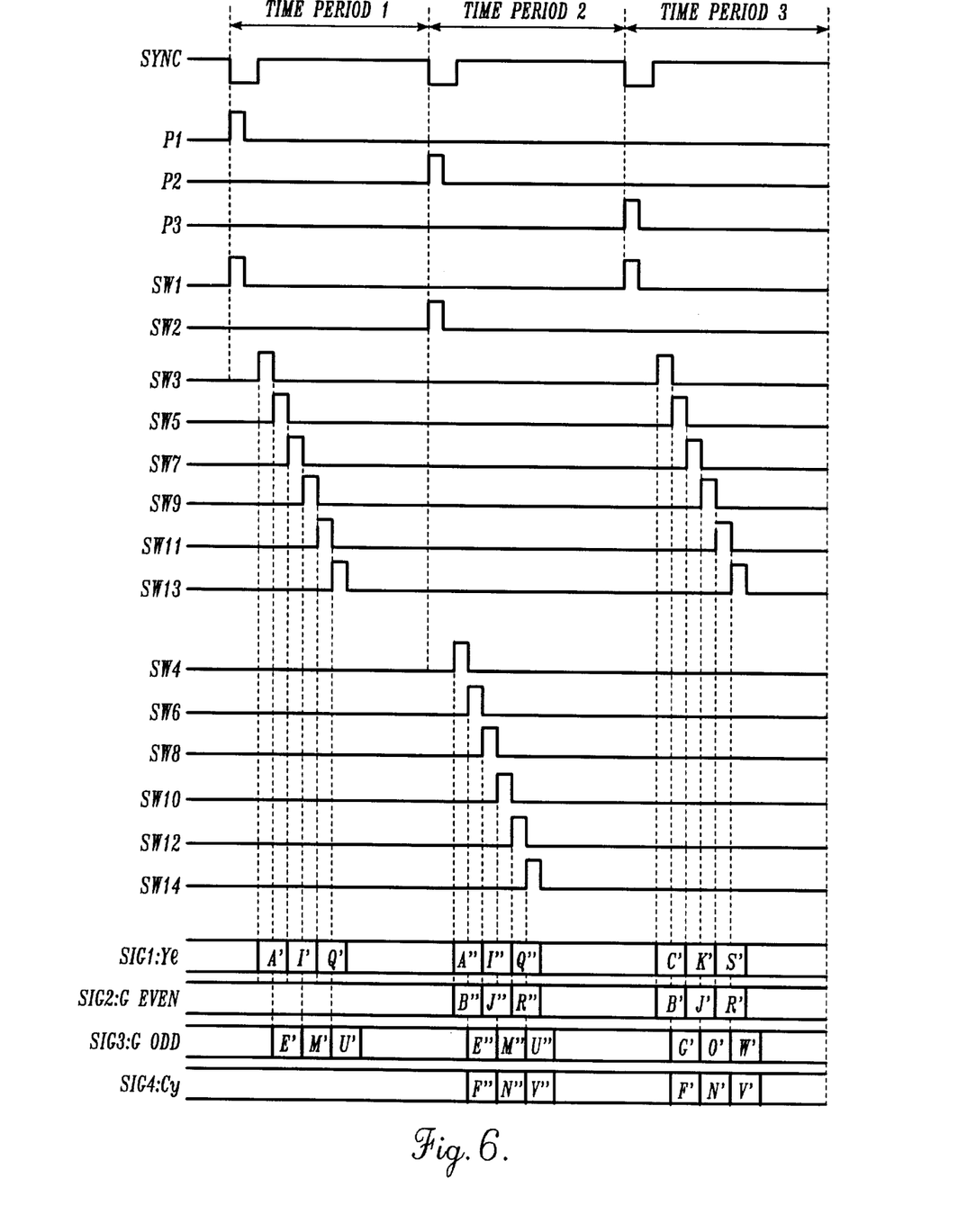
FIG. 6 is a timing diagram illustrating the operation of the six-column two-line pixel reading structure shown in FIG. 5.

The operation of the circuit of FIGS. 5A and 5B is illustrated by the timing diagrams shown in FIG. 6. As shown in FIG. 6, a SYNC signal synchronizes the reading times of the processing circuitry. At the beginning of time period 1, the pixel control signal P1 goes high at the same time as switch set SW1. This causes the signals from the first row of pixels, including pixels 103A, 103E, 103I, 103M, 103Q and 103U, to be amplified by signal amplifiers 205 and be stored on capacitors in sets of two. Specifically, capacitors C1 and C2 store the pixel signal 103A, capacitors C5 and C6 store the pixel signal 103E, capacitors C9 and C10 store the pixel signal 103I, and so on until capacitors C21 and C22, which store the pixel signal 103U. Thus, each of the pixel signals is stored on two capacitors, and these two stored pixel signals are referenced as stored pixel signals 103A' and 103A" for pixel 103A, stored pixel signals 103E' and 103E" for pixel 103E, and so on.

Next, output switches of odd number SW3, SW5, SW7, SW9, SW11 and SW13 are activated in consecutive sequential order, which causes the signals from the capacitors C1, C5, C9, C13, C17 and C21 to be alternately placed on line signals SIG1 and SIG3. Thus, the pixels of a particular row are read sequentially. In this embodiment, the signals which are placed on line signal SIG1 come from capacitors C1, C9 and C17, which in turn come from pixels 103A, 103I and 103Q, which are all Ye pixels. The signals on line signal SIG3 come from capacitors C5, C13 and C21, which come from pixels 103E, 103M and 103U, which are all G pixels. Thus, line signal SIG1 is receiving first row Ye signals and line signal SIG3 is receiving first row G signals.

Although the timing diagrams show the names of the pixel signals (signal 103A' is abbreviated as A', etc.) which are transferred to the line signals after the output switch sets SW3 to SW14 are activated, it is understood that the named signals do not necessarily remain on the line signals for the full time period shown in the diagram, and are shown there only for purposes of illustration as if the charge from each of the capacitors had been transferred to each of the line signals. Line signals SIG1 and SIG2 are obtained simultaneously, as are line signals SIG3 and SIG4, although during time period 1 the output lines SIG2 and SIG4 have not been shown to be charged with any signals.

At the beginning of time period 2, the pixel control signal P2 goes high at the same time as switch set SW2. This causes the signals from the second row of pixels 103B, 103F, 103J, 103N, 103R and 103V (which include G and Cy pixels), to be amplified by signal amplifiers 205, and be stored on capacitors in sets of two. Specifically, capacitors C3 and C4 store the pixel signal 103B, capacitors C7 and C8 store the pixel signal 103F, capacitors C11 and C12 store the pixel signal 103J, and so on, until capacitors C23 and C24, which store the pixel signal 103V. Thus, each of the pixel signals is stored on two capacitors, and these two stored pixel signals are referenced as stored pixel signals 103B' and 103B", respectively, for pixel 103B, stored pixel signals 103F' and 103F" for pixel 103F, and so on. Next, output switches of even number SW4, SW6, SW8. SW10, SW12 and SW14 activate in consecutive order, which cause the signals from capacitors C4, C8, C12, C16, C20 and C24 to be alternately placed on line signals SIG2 and SIG4, and also simultaneously cause the signals from capacitors C2, C6, C10, C14, C18 and C22, which were stored during time period 1, to be alternately placed on line signals SIG1 and SIG3.

The signals which are placed on line signal SIG1 came from capacitors C2, C10 and C18, which were stored during time period 1, which in turn came from first row pixels 103A, 103I and 103Q, which are all Ye pixels. The signals on line signal SIG2 came from capacitors C4, C12 and C20, which were stored during time period 2, which in turn came from second row pixels 103B, 103J and 103R which are all G pixels. Thus, at the points in time period 2 when the switch sets SW4, SW8 and SW12 activate, the line signals SIG1 and SIG2 simultaneously contain signals from pixels 103A and 103B, then 103I and 103J, and then 103Q and 103R, respectively. These are all simultaneous readings of first row Ye pixels with adjacent second row G pixels, as is the goal of the system.

Similarly, the signals on line signal SIG3, which are being placed at alternating times from the simultaneous signals on output lines SIG1 and SIG2, came from capacitors C6, C14 and C22, which were stored during time period 1, which in turn came from first-row pixels 103E, 103M and 103U, which are all G pixels. The signals on line signal SIG4 came from capacitors C8, C16 and C24, which were stored during time period 2, which in turn came from second-row pixels 103F, 103N and 103V, which are all Cy pixels. Thus, at the points during time period 2 when switch sets SW6, SW10 and SW14 activate, line signals SIG3 and SIG4 simultaneously contain signals from pixels 103E and 103F, then 103M and 103N, and then 103U and 103V, respectively. These are all simultaneous readings of first row G pixels with adjacent second-row Cy pixels, as is the goal of the system. Thus, the complete output during time period 2 is simultaneous readings of first row Ye pixels with adjacent second row G pixels on line signals SIG1 and SIG2, respectively, alternating with simultaneous readings of first row G pixels with adjacent second row Cy pixels on output lines SIG3 and SIG4, respectively, in consecutive order of the pixels in FIG. 5A moving from left to right.

At the beginning of time period 3, the pixel control signal P3 goes high at the same time as switch set SW1. This causes the signals from the third row of pixels 103C, 103G, 103K, 103O, 103S and 103W (which include Ye and G pixels), to be amplified by signal amplifiers 205, and be stored on capacitors in sets of two. Specifically, capacitors C1 and C2 store the pixel signal 103C, capacitors C5 and C6 store the pixel signal 103G, and so on until capacitors C21 and C22 which store the pixel signal 103W. Thus, each of the pixel signals is stored on two capacitors, and for pixel 103C these two stored pixel signals are referenced as stored pixel signals 103C' and 103C", respectively, and for pixel 103G they are stored pixel signals 103G' and 103G", and so on. Next, output switches of odd number SW3, SW5, SW7.

SW9, SW11 and SW13, activate in consecutive order, which cause the signals from Capacitors C1, C5, C9, C13, C17 and C21 to be alternately placed on line signals SIG1 and SIG3, and also simultaneously cause the signals from capacitors C3, C7, C11, C15, C19 and C23, which were stored during time period 2, to be alternately placed on line signals SIG2 and SIG4.

The signals which are placed on line signal SIG1 came from capacitors C1, C9 and C17, which were stored during time period 3, which in turn came from third-row pixels 103C, 103K and 103S, which are all Ye pixels. The signals on line signal SIG2 came from capacitors C3, C11 and C19, which were stored during time period 2, which in turn came from second-row pixels 103B, 103J and 103R which are all G pixels. Thus, at the points during time period 3 when switch sets SW3, SW7 and SW11 activate, the line signals SIG1 and SIG2 simultaneously contain signals from pixels 103C and 103B, then 103K and 103J, and then 103S and 103R, respectively. These are all simultaneous readings of third row Ye pixels with adjacent second row G pixels, as is the goal of the system.

Similarly, the signals on line signal SIG3, which are being placed at alternating times from the simultaneous signals on line signals SIG1 and SIG2, came from capacitors C5, C13 and C21, which were stored during time period 3, which in turn came from third-row pixels 103G, 103O and 103W, which are all G pixels. The signals on line signal SIG4 came from capacitors C7, C15 and C23, which were stored during time period 2, which in turn came from second-row pixels 103F, 103N and 103V, which are all Cy pixels. Thus, at the points during time period 3 when the switch sets SW5, SW9 and SW13 activate, the line signals SIG3 and SIG4 simultaneously compare signals from pixels 103G and 103F, then 103O and 103N, and then 103W and 103V, respectively. These are all simultaneous readings of third row G pixels with adjacent second-row Cy pixels, as is the goal of the system. Thus, the complete output during time period 3 is simultaneous readings of third row Ye pixels with adjacent second row G pixels on line signals SIG1 and SIG2, alternating with simultaneous readings of third row G pixels with adjacent second row Cy pixels on line signals SIG3 and SIG4, in consecutive order of the pixels in FIG. 5A moving from left to right.

During time period 4 (not shown), the process repeats as it did during time period 2, so as to allow simultaneous readings of third row Ye pixels with adjacent fourth row G pixels on line signals SIG1 and SIG2, alternating with simultaneous readings of third row G pixels with adjacent fourth row Cy pixels on line signals SIG3 and SIG4, in consecutive order of the pixels in FIG. 5A moving from left to right.

While the preferred embodiment of the invention has been illustrated and described, it will be appreciated that various changes can be made therein without departing from the spirit and scope of the invention. For example, the reading structure of FIG. 5B could be used for different color filter patterns than the one shown. A different color filter pattern could use premier colors (RGB) for simplicity, such as SIG1 could be for red (R), SIG2 and SIG3 could be for green (G), and SIG4 could be for blue (B). By altering the timing and placement of the switches SW3 to SW14, SIG1 to SIG4 could even be for combinations of colors from more than one pixels, such as SIG1 being for Cy+G, SIG2 being for Ye+Mg, SIG3 being for Cy+Mg and SIG4 being for Ye+G, where Cy is cyan, G is green, Ye is yellow and Mg is magenta, as is used in many CCD color image sensors.

As another example, the description herein has been made in terms of reading adjacent rows of a pixel array. However, it can be appreciated that adjacent columns may be read just as easily, the distinction between a row and a column being merely semantic for a pixel array.

As a further example, although the storage devices used to store the pixel signals are capacitors, it can be appreciated that any circuit element that has memory ability may be used, such as DRAMs, SRAMs, EEPROMS, and the like.

Thus, the invention should not be limited to the preferred embodiment described herein, but should be limited only by the claims below.

The embodiments of the invention in which an exclusive property or privilege is claimed are defined as follows:

1. A structure for reading an image sensor having a pixel array, said pixel array including a plurality of individual pixels organized as rows and columns, said pixels outputting pixel signals, said structure being external to said pixels of said pixel array, said structure comprising:

(a) a first set of storage capacitors, said first set of storage capacitors having at least two capacitors associated with each column of said pixel array;

(b) a first set of switches for selectively placing pixel signals from a first row of said pixel array on said first set of storage capacitors, the pixel signal that is output from each individual pixel of said first row being stored on said at least two storage capacitors from said first set of storage capacitors associated with the column of said individual pixel such that the pixel signal is stored twice, once on each of the two storage capacitors;

(c) a second set of storage capacitors, said second set of storage capacitors having at least two capacitors associated with each column of said pixel array;

(d) a second set of switches for selectively placing pixel signals from an adjacent row to said first row of said pixel array on said second set of storage capacitors, the pixel signal that is output from each individual pixel of said adjacent row being stored on said at least two storage capacitors from said second set of storage capacitors associated with the column of said individual pixel such that the pixel signal is stored twice, once on each of the two storage capacitors; and (e) a third set of switches for selectively reading out said pixel signals stored on said first and second set of storage capacitors onto a set of output lines as line signals.

2. The structure of claim 1 further including signal preamplifiers for amplifying the pixel signals prior to storage on said first and second set of capacitors.

3. The structure of claim 1 wherein the line signals from the first and second set of capacitors are amplified by a charge amplifier.

4. The structure of claim 1 wherein the pixel array has superimposed thereon a color filter pattern.

5. The structure of claim 4 wherein said rows of the pixel array are divided into a first row group and a second row group, said first row group and said second row group interlacing in an alternating fashion to form said array, and said color filter pattern comprises alternating green filters and yellow filters on said first row group and alternating green filters and cyan filters on said second row group.

6. The structure of claim 1 further including means for activating said third set of switches such that said first and second set of capacitors are sequentially read until each individual pixel in said first row and said adjacent row are output as line signals.

7. The structure of claim 5 further including means for activating said third set of switches such that said first and second set of capacitors are sequentially read until each individual pixel in said first row and said adjacent row are output as line signals.

8. A color MOS image sensor comprising:
- a pixel array formed from a plurality of individual pixels organized as rows and columns, said pixel array having superimposed thereon a color filter pattern; and
- a two-line reading structure being external to said pixels of said pixel array and connected to said pixel array for simultaneously reading pixels from adjacent rows of said pixel array, said reading structure comprising:
  (a) a first set of storage capacitors, said first set of storage capacitors having at least two capacitors associated with each column of said pixel array;
  (b) a first set of switches for selectively placing signals from a first row of said pixel array on said first set of storage capacitors, the signal that is read from each individual pixel of said first row being stored on said at least two storage capacitors from said first set of storage capacitors associated with the column of said individual pixel such that the pixel signal is stored twice, once on each of the two storage capacitors;
  (c) a second set of storage capacitors, said second set of storage capacitors having at least two capacitors associated with each column of said pixel array;
  (d) a second set of switches for selectively placing signals from an adjacent row to said first row of said pixel array on said second set of storage capacitors, the signal that is read from each individual pixel of said adjacent row being stored on said at least two storage capacitors from said second set of storage capacitors associated with the column of said individual pixel such that the pixel signal is stored twice, once on each of the two storage capacitors; and
  (e) a third set of switches for selectively reading out said signals from said first and second set of storage capacitors onto a set of output lines as line signals.

9. The image sensor of claim 8 wherein at least two of the line signals on said output lines at specified times simultaneously contain signals from pixels of adjacent rows and of the same column.

10. The image sensor of claim 9 wherein said simultaneous line signals on said output lines are placed alternately with another set of simultaneous line signals on a second set of output lines.

11. The image sensor of claim 8 wherein said line signals are processed by a set of output electronics so as to produce signals which are combinations of said signals from said pixels in adjacent rows.

12. The image sensor of claim 8 wherein said rows of the pixel array are divided into a first row group and a second row group, said first row group and said second row group interlacing in an alternating fashion to form said array, and said color filter pattern comprises alternating green filters and yellow filters on said first row group and alternating green filters and cyan filters on said second row group.

13. The structure of claim 8 further including means for activating said third set of switches such that said first and second set of capacitors are sequentially read until each individual pixel in said first row and said adjacent row are output as line signals.

14. The structure of claim 12 further including means for activating said third set of switches such that said first and second set of capacitors are sequentially read until each individual pixel in said first row and said adjacent row are output as line signals.

15. A method for reading adjacent rows of a color image sensor having a pixel array of a plurality of individual pixels organized as a plurality of rows and columns, said method comprising the steps of:
  (a) storing the signal that is read from each individual pixel of a first row of the pixel array on at least two memory cells associated with each said individual pixel of said first row such that the pixel signal is stored twice, once on each of the two memory cells, said at least two memory cells being external to said pixels;
  (b) storing the signal that is read from each individual pixel of an adjacent row to said first row on at least two memory cells associated with each said individual pixel of said adjacent row such that the pixel signal is stored twice, once on each of the two memory cells, said at least two memory cells being external to said pixels;
  (c) reading out the signals from two adjacent pixels, one from said first row and one from said adjacent row, by selectively reading at least one of each of said memory cells on which each of the pixel signals was stored.

16. The method of claim 15 wherein said memory cells are formed from capacitors.

17. The method of claim 15 wherein said step of reading out the signals is accomplished by reading said two adjacent pixels from each row in sequential manner.

18. A color filter pattern for a color integrated circuit image sensor, said image sensor including a pixel array having a plurality of rows, said plurality of rows divided into a first row group and a second row group, said first row group and said second row group interlacing in an alternating fashion to form said array, said color filter pattern comprising:
  (a) alternating green filters and yellow filters on said first row group; and
  (b) alternating green filters and cyan filters on said second row group.

* * * * *